United States Patent
Zheng et al.

(10) Patent No.: US 8,096,136 B2
(45) Date of Patent: Jan. 17, 2012

(54) HEAT DISSIPATION DEVICE

(75) Inventors: Dong-Bo Zheng, Shenzhen (CN); Meng Fu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 648 days.

(21) Appl. No.: 12/202,404

(22) Filed: Sep. 1, 2008

(65) Prior Publication Data

US 2009/0314465 A1 Dec. 24, 2009

(30) Foreign Application Priority Data

Jun. 20, 2008 (CN) .......................... 2008 1 0067942

(51) Int. Cl.
*F25B 21/02* (2006.01)
*H05K 7/20* (2006.01)

(52) U.S. Cl. .... 62/3.2; 62/259.2; 165/80.3; 165/104.33; 361/697; 361/700

(58) Field of Classification Search ............. 165/104.33, 165/80.3; 62/3.2, 259.2; 361/679.52, 700, 361/697

See application file for complete search history.

(56) References Cited

U.S. PATENT DOCUMENTS

| | | | | |
|---|---|---|---|---|
| 3,100,969 | A | * | 8/1963 | Elfving ............................ 62/3.6 |
| 5,282,364 | A | * | 2/1994 | Cech ................................ 62/3.2 |
| 5,621,614 | A | * | 4/1997 | O'Neill .................... 165/104.33 |
| 5,737,923 | A | * | 4/1998 | Gilley et al. ..................... 62/3.7 |
| 6,236,565 | B1 | * | 5/2001 | Gordon ......................... 361/695 |
| 6,711,018 | B2 | * | 3/2004 | Luo ................................. 62/3.2 |
| 6,798,659 | B2 | * | 9/2004 | Chen ............................. 361/697 |
| 7,059,137 | B2 | * | 6/2006 | Childress ..................... 62/259.2 |
| 7,190,576 | B2 | * | 3/2007 | Wang et al. ..................... 62/3.2 |
| 2005/0259405 | A1 | * | 11/2005 | He ................................ 361/729 |
| 2007/0165374 | A1 | * | 7/2007 | Chen et al. ................... 361/687 |
| 2007/0195499 | A1 | * | 8/2007 | Chu .............................. 361/695 |
| 2007/0204627 | A1 | * | 9/2007 | Pan ................................. 62/3.2 |

FOREIGN PATENT DOCUMENTS

| | | |
|---|---|---|
| CN | 1996501 A | 7/2007 |
| JP | 2000269674 A * | 9/2000 |
| JP | 2003008271 A * | 1/2003 |

\* cited by examiner

*Primary Examiner* — Leonard R Leo

(74) *Attorney, Agent, or Firm* — Altis Law Group, Inc.

(57) ABSTRACT

A heat dissipation device includes a base, a fin group mounted on a top of the base, a fan mounted on a top of the fin group, a hollow fan duct mounted on the fan and a thermoelectric cooler secured on the fan duct. The thermoelectric cooler includes a cooling module having the Peltier effect and extending through a sidewall of the fan duct, and a heat sink enclosed by the fan duct and thermally contacting with the cooling module. The cooling module has a cold surface located at an inner side of the fan duct, and the heat sink thermally contacts with the cold surface of the cooling module. An airflow generated by the fan first flows through the heat sink and then reaches the fin group via the fan.

12 Claims, 3 Drawing Sheets

HEAT DISSIPATION DEVICE

BACKGROUND OF THE INVENTION

1. Field of the Invention

The present invention relates to a heat dissipation device, and more particularly to a heat dissipation device having a plurality of thermoelectric coolers to improve heat dissipation efficiency thereof, by lowering a temperature of an airflow before it is driven by a fan to flow to a fin group.

2. Description of Related Art

When a CPU of an electronic apparatus, for example, a computer operates, heat must be quickly carried away from the CPU so that the operation of the CPU can be maintained in a normal condition. A conventional heat dissipation apparatus for this purpose commonly comprises of a heat sink having a plurality of upright fins, a base adapted for being mounted on the top of the CPU, and a fan mounted on the heat sink above the CPU. The heat sink is designed to increase length of the fins to improve heat dissipation efficiency thereof. However, increasing the length of the fins also increases a thickness of a border layer of air on a top surface of the fins. The border layer of air is a layer of stagnant air formed on a surface of an article. The thickness of the border layer of air is inversely proportional to the amount of heat that can be transferred from the surface of the heat sink to the surrounding air. Furthermore, the length of the fins can not increase too long due to space limitations in modern computers. Therefore, to improve the heat dissipating capacity of the heat sink by increasing the length of the fins of the heat sink has its limitation.

Another factor that can determine the heat dissipating capacity of a heat sink is the temperature difference between the heat sink and an airflow passing through the heat sink. The temperature difference is proportional to the amount of heat that can be transferred from the heat sink. Generally, the average temperature of ambient air surrounding the heat sink is not much lower than that of the heat sink, and the temperature difference between the airflow and the heat sink is small. The amount of heat that is transferred from the heat sink to the airflow is limited.

What is needed, therefore, is a heat dissipation device which has a high heat dissipating capacity.

SUMMARY OF THE INVENTION

A heat dissipation device includes a heat absorber, a fin group mounted on a top of the heat absorber, a fan mounted on a top of the fin group, a hollow fan duct mounted on the fan and a thermoelectric cooler secured on the fan duct. The thermoelectric cooler includes a cooling module extending through a sidewall of the fan duct, a first heat sink enclosed by the fan duct and thermally contacting with a cold surface of the cooling module and second heat sink located outside the fan duct and thermally contacting with a hot surface of the cooling module. The cooling module has the Peltier effect. When the fan works, an airflow first flows through the first heat sink and then reaches the fin group via the fan.

Other advantages and novel features will become more apparent from the following detailed description of preferred embodiments when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
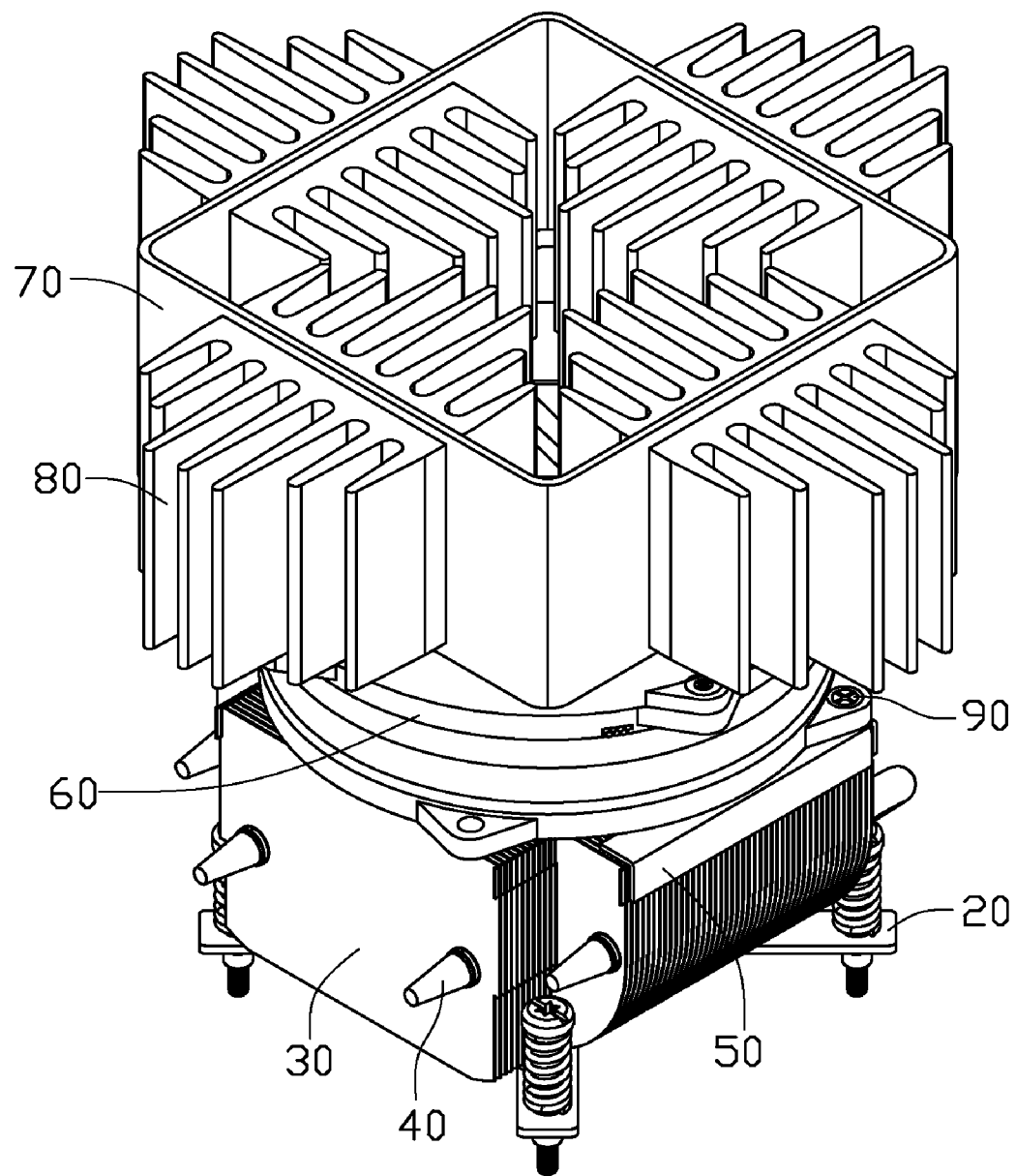
FIG. 1 is an assembled view of a heat dissipation device in accordance with a preferred embodiment of the present invention.
Figure 2:
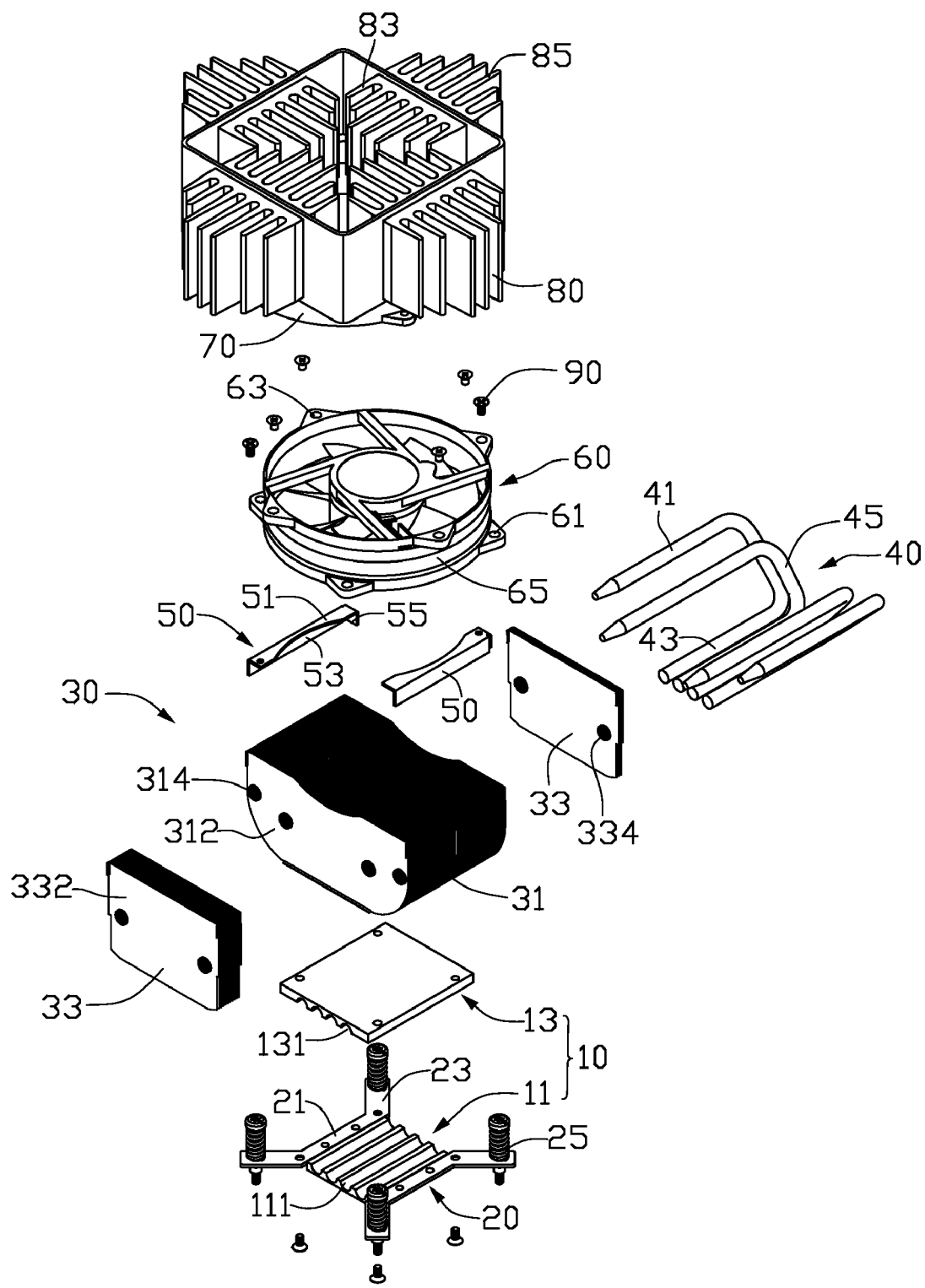
FIG. 2 is an exploded view of the heat dissipation device of FIG. 1.

Referring to FIGS. 1-2, a heat dissipation device is used to dissipate heat generated by electronic components (not shown) mounted on a printed circuit board (not shown) which is located in a computer enclosure (not shown). The heat dissipation device comprises a heat absorber 10 for thermally contacting with the electronic components. A pair of mounting brackets 20 is located at opposite sides of the heat absorber 10 for mounting the heat absorber 10 on the printed circuit board. A fin group 30 is located at a top of the heat absorber 10. Four U-shaped heat pipes 40 connect with the heat absorber 10 and the fin group 30. A fan 60 is mounted on a top of the fin group 30. A fan duct 70 is mounted on a top of the fan 60. Four thermoelectric coolers 80 are mounted on the fan duct 70.

Each heat pipe 40 comprises an elongated condensing portion 41, an elongated evaporating portion 43 parallel to the condensing portion 41, and a connecting portion 45 interconnecting with the condensing portion 41 and the evaporating portion 43. The evaporating portions 43 of the heat pipes 40 are parallel to each other and are arranged side by side in the heat absorber 10. The condensing portions 41 are arranged into two groups each including two condensing portions 41 and located beside and above the evaporating portions 43.

The heat absorber 10 is secured on the printed circuit board by the pair of mounting brackets 20 when the heat dissipation device is used. The heat absorber 10 comprises a supporting plate 11 and an engaging plate 13 engaging with the supporting plate 11. The supporting plate 11 and engaging plate 13 are made of metallic material such as copper and each have a substantially rectangular configuration. The supporting plate 11 defines four parallel grooves 111 at a center portion of a top surface thereof. The engaging plate 13 defines four parallel grooves 131 at a bottom surface thereof and corresponding to the grooves 111 of the supporting plate 11. The engaging plate 13 and the supporting plate 11 define cooperatively four passages (not labeled) by the grooves 111, 131. The evaporating portions 43 of the heat pipes 40 are congregated and received in corresponding passages of the heat absorber 10.

The mounting brackets 20 engage with front and rear sides of the engaging plate 13 of the heat absorber 10, respectively. Each mounting bracket 20 comprises an elongated mounting lever 21 engages with the engaging plate 13 and a pair of arms 23 extending outwardly and slantwise from opposite ends of the mounting lever 21. A pair of fasteners 25 extend through the arms 23 for securing the heat absorber 10 on the printed circuit board.

The fin group 30 comprises a first fin group 31 and two second fin groups 33 located at right and left sides of the first fin group 31. The first fin group 31 comprises a plurality of parallel first fins 312. The first fins 312 each have two arc-shaped edges at the front and rear sides thereof. The first fins 312 extend a plurality of flanges (not labeled) to form a flat bottom surface (not labeled) to weld to a top surface of the engaging plate 13 of the heat absorber 10. The first fins 312 each define two pairs of through holes 314 located at front and rear portions thereof to receive the condensing portions 41 of the heat pipes 40. The second fin groups 33 have a plurality of rectangular second fins 332. The two second fin groups 33 sandwich a central portion of the first fin group 31 therebetween, and the first fin group 31 has the front and rear sides thereof extending outwardly and beyond corresponding sides of the second fin groups 33. The second fins 332 each define two through holes 334 aligned with the through holes 314 which are located at inner portions of the first fins 312 of the first fin group 31. Two of the condensing portions 41 of the heat pipes 40 extend through two through holes 314 of the first fins 312 of the first fin group 31 and the through holes 334 of the second fins 332 of the second fin groups 33. The other two of the condensing portions 41 of the heat pipes 40 extend through two through holes 314 which are located adjacent to the front and rear sides of the first fins 312 of the first fin group 31.

A pair of fan brackets 50 are mounted on the front and rear sides of the first fin group 31 of the fin group 30 and connect with the fan 60 to mount the fan 60 on the fin group 30. The fan bracket 50 is formed by bending a metal sheet. Each fan bracket 50 comprises a mounting portion 51 with a concaved, arced side, an elongated baffling portion 53 perpendicularly and downwardly extending from a long edge of the mounting portion 51, and a tab 55 perpendicularly and downwardly extending from a shorter edge of the mounting portion 51. The mounting portions 51 of the fan brackets 50 abut against a top surface of the first fin group 31. The concaved, arced sides of the mounting portions 51 face each other. The baffling portions 53 of the fan brackets 50 abut against the front and rear sides of the first fin group 31. The tabs 55 of the brackets 50 abut against the right side of the first fin group 31.

The fan 60 has an annular frame 65. The fan 60 has four protruded portions 61 equidistantly protruded from a bottom edge of the frame 65 and four engaging portions 63 equidistantly protruded from a top edge of the frame 65 and alternated with the protruded portions 61. Two self-tapping screws 90 extend through two opposite protruded portions 61 and two diagonally opposite ends of the mounting portions 51 of the fan brackets 50 to engage in the fins 312 of the first fin group 31 of the fin group 30 to thereby mount the fan 60 on the first fin group 31 via the fan brackets 50.

Figure 3:
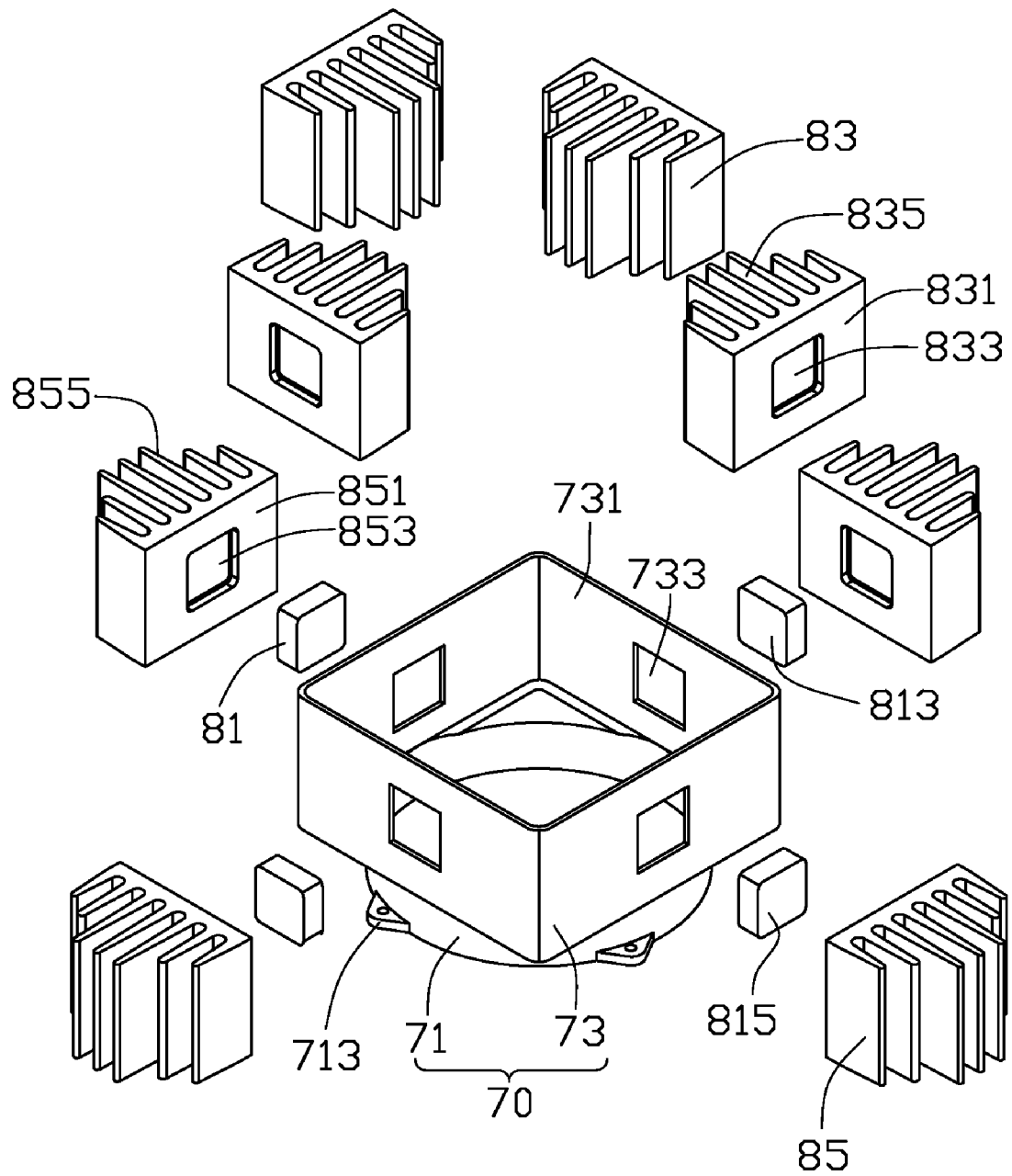
FIG. 3 is an exploded view of thermoelectric coolers and a fan duct of the heat dissipation device of FIG. 1.

Referring to FIG. 3 also, the fan duct 70 comprises a round, tubular connecting portion 71 and a rectangular, tubular extending portion 73 extending upwardly from a top edge of the connecting portion 71. Four substantially triangular webs (not labeled) each extends horizontally from the top edge of the connecting portion 71 to connect with a corresponding corner of the connecting portion 71 thereby to ensure that the extending portion 73 is integrally continuous with the connecting portion 71. The connecting portions 71 has four linking portions 713 each aligned with a corresponding engaging portion 63 of the fan 60. Four screws (not labeled) extend through the linking portions 713 and engage with the engaging portions 63 to assemble the fan duct 70 on a top of the fan 60. A bore diameter of the connecting portion 71 is equal to that of the frame 65 of the fan 60. Thus, the connection of the frame 65 of the fan 60 and the connecting portion 71 of the fan duct 70 is airproof. The extending portion 73 comprises four elongated mounting plates 731. The four mounting plates 731 interconnect with each other to form a frame (not labeled) which has a room at a center thereof. Each mounting plate 731 defines a rectangular receiving hole 733 at a central portion thereof to receive the thermoelectric cooler 80.

Each thermoelectric cooler 80 comprises a cubical cooling module 81 having the Peltier effect. A first heat sink 83 and a second heat sink 85 contact with opposite ends of the cooling module 81, respectively. The cooling module 81 is embedded in the receiving hole 733 of the mounting plate 731 of the extending portion 73 of the fan duct 70. The cooling module 81 has a cold surface 813 located at an inner side of the extending portion 73 of the fan duct 70 and a hot surface 815 opposite to the cold surface 813 and located at an outside of the extending portion 73 of the fan duct 70. The first and second heat sinks 83, 85 thermally contact with the cold surface 813 and the hot surface 815, respectively.

The first and second heat sinks 83, 85 are symmetrical to each other relative to the mounting plate 731 of the extending portion 73. The first heat sink 83 comprises a rectangular base 831 having a first surface (not labeled) and a second surface (not labeled) opposite to the first surface. A plurality of fins 835 perpendicularly extends from the second surface of the base 831 of the first heat sink 83. A recess 833 is defined in a central portion of the first surface of the base 831. An end of the cooling module 81 which has the cold surface 813 intimately engages in the recess 833 of the first heat sink 83. The first surface of the base 831 of the first heat sink 83 thermally contact with an inner surface of the mounting plate 731 of the extending portion 73 of the fan duct 70. The cold surface 813 is used to absorb heat of the first heat sink 83. The second heat sink 85 comprises a rectangular base 851 having a first surface (not labeled) and a second surface (not labeled) opposite to the first surface. A plurality of fins 855 perpendicularly extends from the second surface of the base 851 of the second heat sink 85. A recess 853 is defined at a central portion of the first surface of the base 851. An end of the cooling module 81 which has the hot surface 815 intimately engages in the recess 853 of the second heat sink 85. The first surface of the base 851 of the second heat sink 85 thermally contact with an outside surface of the mounting plate 731 of the extending portion 73 of the fan duct 70. The hot surface 815 is used to transfer heat of the cooling module 81 to the second heat sink 85.

In use, heat generated by the electronic components is absorbed by the heat absorber 10 and transferred to the fin group 30 by the heat pipes 40. Airflow produced by the fan 60 enters into the extending portion 73 of the fan duct 70 and the airflow is cooled by the first heat sinks 83 and the cold surfaces 813 of the cooling modules 81 of the thermoelectric coolers 80. Then, the cooled airflow flows through the connecting portion 71 of the fan duct 70 and the fan 60 into the fin group 30 to cool the fin group 30. In this case, airflow produced by the fan 60 is pre-cooled by the first heat sinks 83 of the thermoelectric coolers 80; thus, the cooled airflow has a temperature lower than the average temperature in the computer enclosure. Therefore, the airflow can effectively take heat away from the fin group 30 to lower the temperature of the electronic components.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device adapted for dissipating heat generated by electronic components, the heat dissipation device comprising:
   a heat absorber adapted for thermally contacting the electronic components;
   a fin group mounted on the heat absorber;
   a fan mounted on the fin group;
   a fan duct mounted on the fan; and
   a thermoelectric cooler secured on the fan duct, the thermoelectric cooler comprising a cooling module, a first heat sink and a second heat sink, the cooling module having a Peltier effect and extending through a sidewall of the fan duct and secured on the sidewall, opposite ends of the cooling module extending through the sidewall and located at opposite sides of the sidewall, a cold surface and a hot surface formed on the opposite ends of the cooling module, respectively, the first heat sink and the second heat sink located at opposite sides of the sidewall, each of the first heat sink and the second heat sink define a recess therein, the opposite ends of the cooling module correspondingly received in the recesses of the first heat sink and the second heat sink and intimately engaging with the first heat sink and the second heat sink, the first heat sink enclosed by the fan duct and thermally contacting the cold surface of the cooling module, the second heat sink located at an outside of the fan duct and thermally contacting the hot surface of the cooling module;

wherein when the fan works, an airflow first flows through the first heat sink and then reaches the fin group via the fan;

wherein each of the first heat sink and the second heat sink comprises a base, each base having a first surface; and wherein the first surfaces of the bases of the first heat sink and the second heat sink thermally contact an inner surface and an outer surface of the sidewall of the fan duct, respectively.

2. The heat dissipation device as claimed in claim 1, wherein each base further comprises a second surface opposite to the first surface, a plurality of fins extending from the second surface of the base, the recess being defined in the base, the first surface of the base of the first heat sink thermally contacting the cold surface of the cooling module, and the first surface of the base of the second heat sink thermally contacting the hot surface of the cooling module.

3. The heat dissipation device as claimed in claim 1, wherein the fan duct comprises a round, tubular connecting portion connecting with the fan and a rectangular, tubular extending portion extending upwardly from a top edge of the connecting portion, and a connection of the connecting portion and the fan is airproof, the thermoelectric cooler being secured to the extending portion.

4. The heat dissipation device as claimed in claim 3, wherein the extending portion of the fan duct comprises four elongated mounting plates interconnecting with each other, the cooling module extending through one of the mounting plates.

5. The heat dissipation device as claimed in claim 1 further comprising a heat pipe, wherein the heat pipe has an evaporating portion extending through the heat absorber and a condensing portion extending through the fin group.

6. The heat dissipation device as claimed in claim 1, wherein the fin group comprises a first fin group connecting with the fan and a pair of second fin groups thermally contacting opposite ends of the first fin group.

7. The heat dissipation device as claimed in claim 1 further comprising a pair of fan brackets, wherein the fan brackets are mounted on the fin group and connect with the fan, each fan bracket comprising a mounting portion abutting against a top surface of the fin group, a baffling portion extending downwardly from an edge of the mounting portion and abutting against a side of the fin group, and a tab extending downwardly from another edge of the mounting portion and abutting against another side of the fin group.

8. The heat dissipation device as claimed in claim 7, wherein two self-tapping screws extend through corners of the fan and the mounting portions and engage with the fins of the fin group to mount the fan on the fin group.

9. A heat dissipation device adapted for dissipating heat generated by electronic components, the heat dissipation device comprising:

a fan;

a fan duct mounted on the fan, the fan duct comprising a plurality of sidewalls interconnecting with each other; and a thermoelectric cooler secured on the fan duct, the thermoelectric cooler comprising a plurality of cooling modules, a plurality of first heat sinks and a plurality of second heat sinks, each of the cooling modules having a hot surface and a cooling surface located at opposite ends thereof, the cooling modules spaced from each other and extending through the sidewalls of the fan duct, the opposite ends of each of the cooling modules located at opposite sides of a corresponding sidewall of the fan duct and thermally contacting one of the first and second heat sinks, respectively, the first heat sinks enclosed by the fan duct and thermally contacting the cooling surfaces of the cooling modules, and the second heat sinks located at an outside of the fan duct and thermally contacting the hot surfaces of the cooling modules;

wherein each of the first heat sinks and the second heat sinks is defined a recess therein, the opposite ends of the cooling module are received in the recesses of the first heat sinks and the second heat sinks;

wherein each of the first heat sink and the second heat sink comprises a base, each base having a first surface; and wherein the first surfaces of the bases of the first heat sink and the second heat sink thermally contact an inner surface and an outer surface of the sidewall of the fan duct, respectively.

10. The heat dissipation device as claimed in claim 9, wherein the first heat sinks thermally contact inner surfaces of the sidewalls and the second heat sinks thermally contact outer surfaces of the sidewalls.

11. The heat dissipation device as claimed in claim 9, wherein the first heat sinks are spaced from each other.

12. A heat dissipation device adapted for dissipating heat generated by electronic components, the heat dissipation device comprising:

a hollow fan duct comprising a first end and an opposite second end, the first end and the second end both being open;

a thermoelectric cooling module comprising a hot surface and an opposite cooling surface, the thermoelectric cooling module extending through and fixed on the fan duct with the cooling surface inside the fan duct while the hot surface out of the fan duct; a first heat sink received in the fan duct and attaching to the cooling surface of the thermoelectric cooling module inside the fan duct;

a second heat sink located outside the fan duct and attaching to the hot surface of the thermoelectric cooling module out of the fan duct;

a fan coupled to one of the first end and second end of the fan duct, the fan being adapted for generating airflow flowing through the fan duct along a direction from the first end to the second end;

wherein each of the first heat sink and the second heat sink comprises a base, the base having a first surface; and wherein the first surfaces of the bases of the first heat sink and the second heat sink thermally contact an inner surface and an outer surface of the sidewall of the fan duct, respectively.

* * * * *